(12) United States Patent
Zhou

(10) Patent No.: US 11,038,063 B2
(45) Date of Patent: Jun. 15, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/114,749

(22) Filed: Aug. 28, 2018

(65) Prior Publication Data

US 2019/0067485 A1 Feb. 28, 2019

(30) Foreign Application Priority Data

Aug. 31, 2017 (CN) .......................... 201710767173.X

(51) Int. Cl.
*H01L 21/768* (2006.01)
*H01L 29/78* (2006.01)
(Continued)

(52) U.S. Cl.
CPC ...... *H01L 29/7856* (2013.01); *H01L 21/0337* (2013.01); *H01L 21/2652* (2013.01); *H01L 21/31155* (2013.01); *H01L 21/76832* (2013.01); *H01L 21/823821* (2013.01); *H01L 27/0924* (2013.01); *H01L 29/0847* (2013.01);
(Continued)

(58) Field of Classification Search
CPC ............. H01L 29/7856; H01L 29/7848; H01L 29/6656; H01L 21/2652; H01L 29/66803; H01L 27/0924; H01L 21/823821; H01L 29/0847; H01L 29/7842; H01L 21/0337; H01L 21/31155; H01L 21/76832; H01L 29/165
See application file for complete search history.

(56) References Cited

U.S. PATENT DOCUMENTS 6,689,671 B1 * 2/2004 Yu ..................... H01L 21/02381
438/486
2001/0005613 A1 * 6/2001 Akiyama ........ H01L 21/823807
438/276
(Continued)

FOREIGN PATENT DOCUMENTS

CN 105551958 A 5/2016

*Primary Examiner* — Marcos D. Pizarro
*Assistant Examiner* — Sue Tang
(74) *Attorney, Agent, or Firm* — Anova Law Group, PLLC

(57) ABSTRACT

A semiconductor structure and fabrication method thereof are provided. The fabrication method includes: providing a base substrate including a substrate and a plurality of fins on the substrate; forming gate structures across the fins, to cover a portion of sidewalls of the fins and a portion of top surfaces of the fins; forming stress layers in the fins on sides of each gate structure; forming barrier layers on sidewalls of the gate structure; and forming doped regions by applying first ion implantation processes to the fins under the stress layers using the barrier layers as a mask.

14 Claims, 4 Drawing Sheets

(51) Int. Cl.
    *H01L 21/8238*    (2006.01)
    *H01L 21/3115*    (2006.01)
    *H01L 21/033*     (2006.01)
    *H01L 29/08*      (2006.01)
    *H01L 29/66*      (2006.01)
    *H01L 21/265*     (2006.01)
    *H01L 27/092*     (2006.01)
    *H01L 29/165*     (2006.01)

(52) U.S. Cl.
    CPC .... *H01L 29/6656* (2013.01); *H01L 29/66803* (2013.01); *H01L 29/7842* (2013.01); *H01L 29/7848* (2013.01); *H01L 29/165* (2013.01)

(56) References Cited

U.S. PATENT DOCUMENTS

| | | | | |
|---|---|---|---|---|
| 2006/0186557 | A1* | 8/2006 | Shima | H01L 29/045 257/213 |
| 2009/0246926 | A1* | 10/2009 | Gehring | H01L 21/823814 438/305 |
| 2014/0001540 | A1* | 1/2014 | Wang | H01L 29/6659 257/329 |
| 2016/0126338 | A1* | 5/2016 | Zhao | H01L 29/7851 257/192 |

* cited by examiner

SEMICONDUCTOR STRUCTURE AND FABRICATION METHOD THEREOF

CROSS-REFERENCES TO RELATED APPLICATION

This application claims the priority of Chinese Patent Application No. 201710767173.X, filed on Aug. 31, 2017, the content of which is incorporated herein by reference in its entirety.

TECHNICAL FIELD

The present disclosure generally relates to the field of semiconductor technologies and, more particularly, relates to a semiconductor structure and its fabrication method.

BACKGROUND

As semiconductor technologies develop rapidly, semiconductor devices are developed toward having a higher semiconductor device density and a higher integration level. Transistors are widely used as the most basic semiconductor devices. As the semiconductor device density and the integration level increase continuously, sizes of the gates in planar transistors decrease continuously, and the planar transistors have weaker controlling abilities on channel currents. Correspondingly, short-channel effects (SCE) occur easily and leakage currents increase. The semiconductor devices then have poor performances.

To further decrease sizes of metal-oxide-semiconductor field effect transistor (MOSFET) devices, focuses of the semiconductor technology have gradually changed from planar MOSFETs to more effective non-planar three-dimensional transistors, such as fin field effect transistors (FinFETs). In a FinFET, a gate structure can control an ultra-thin part (a fin) at least from two sides of the fin, to provide a much stronger controlling ability on channels and to effectively suppress the short-channel effect. Moreover, in comparison with other devices, a FinFET is more compatible with the current fabrication processes for integrated circuits.

However, performances of the FinFET devices still need to be improved. The disclosed devices and methods are directed to at least partially alleviate one or more problems set forth above and to solve other problems in the art.

SUMMARY

One aspect of the present disclosure provides a method of forming a semiconductor structure. The fabrication method includes: providing a base substrate including a substrate and a plurality of fins on the substrate; forming gate structures each across the fins, to cover a portion of sidewalls of the fins and a portion of top surfaces of the fins; forming stress layers in each fin on sides of each gate structure; forming barrier layers on sidewalls of each gate structure; and forming doped regions by a first ion implantation process on a portion of the fins under the stress layers using the barrier layers as an etch mask.

Another aspect of the present disclosure provides a semiconductor structure fabricated by any methods in the present disclosure. The semiconductor structure includes: a substrate; a plurality of fins on the substrate; gate structures each across the fins, to cover a portion of sidewalls of the fins and a portion of top surfaces of the fins; stress layers in each fin on sides of each gate structure; stress layer doped regions in the stress layers; doped regions in the fins under the stress layers; a stop layer on the stress layers and on the gate structures; and barrier layers on sidewalls of each gate structure. The stress layer doped regions and the doped regions together constitute the source/drain doped regions of the semiconductor structure. The barrier layers are outside the stop layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like portions.

Figure 1:
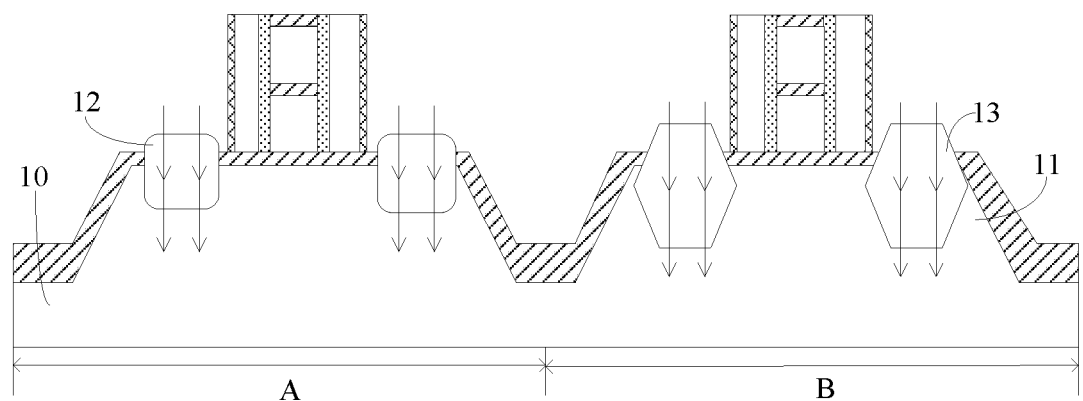
FIG. 1 illustrates a semiconductor structure corresponding to a certain stage for forming an exemplary semiconductor structure.

FIG. 1 illustrates a semiconductor structure corresponding to a certain stage for forming an exemplary semiconductor structure.

Referring to FIG. 1, a semiconductor structure may be formed by: proving a substrate 10 including a first region A for forming N-type transistors and a second region B for forming P-type transistors; forming fins 11 protruding from the substrate 10; form gate structures each across the fins 11 to cover a portion of sidewalls of the fins 11 and a portion of top surfaces of the fins 11; forming stress layers in each fin 11 on sides of each gate structure; using the stress layers in the first region A as first stress layers 12 and using the stress layers in the second region B as second stress layers 13; applying multiple first ion implantation processes on the first stress layers 12, on the fins under the first stress layers 12, on the second stress layers 13 and on the fins under the second stress layers 13. The first ion implantation processes on the fins under the first stress layers 12 and on the fins under the second stress layers 13 may require a high implantation depth and a high ion injection energy. The high ion injection energy may easily damage gate dielectric layers in the gate structures, and then induce a poor performance of the formed semiconductor structure.

The present disclosure provides a semiconductor structure and fabricating method. The fabrication method includes: providing a base substrate including a substrate and a plurality of fins protruding from the substrate; forming gate structures each across the fins, to cover a portion of sidewalls of the fins and a portion of top surfaces of the fins; forming stress layers in each fin on sides of each gate structure; forming barrier layers on the sidewalls of each gate structure; and forming doped regions by first ion implantation processes on a portion of the fins under the stress layers.

In the method of the present disclosure, the barrier layers may be formed on the sidewalls of each gate structure after forming the stress layers in each fin on the sides of each gate structure, and the first ion implantation processes may be subsequently performed on a portion of the fins under the stress layers for forming doped regions. The ion implantation processes may be performed using a high implantation depth and may need a high ion injection energy. The barrier layers may block the ion implantation near sides of the gate structure, and avoid damages to the gate structure due to the high ion implantation energy. Correspondingly, the performance of the formed semiconductor structures may be improved. Moreover, a stop layer may be further formed on the stress layers and on the gate structures, after forming the stress layers but before forming the barrier layers. The stop layers may protect the stress layers and the fins in the ion implantation processes, and also may define a stop position when forming conductive through holes. Correspondingly, the method of the present disclosure may simultaneously improve the performance of the formed semiconductor structure, simplify the fabrication process, and enhance the process efficiency.

FIG. 2 to FIG. 6 illustrate semiconductor structures corresponding to certain stages for forming an exemplary semiconductor structure according to various disclosed embodiments of present disclosure. FIG. 7 illustrates an exemplary method for forming a semiconductor structure according to various disclosed embodiments.

Figure 2:
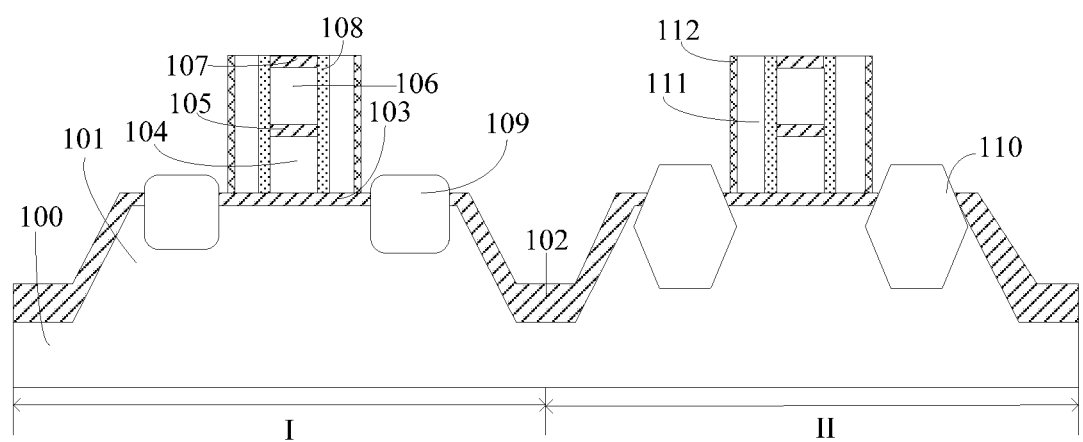
FIGS. 2-6 and FIG. 6A illustrate semiconductor structures corresponding to certain stages for forming an exemplary semiconductor structure according to various disclosed embodiments of the present disclosure.

Referring to FIG. 2, a base substrate may be provided (e.g., in Step S802 in FIG. 7). The base substrate may include a substrate 100 and a plurality of fins 101 protruding from the substrate 100. Then gate structures each across the fins 101 may be formed, to cover a portion of sidewalls of the fins 101 and a portion of top surfaces of the fins 101 (e.g., in Step S804 in FIG. 7). Stress layers may be formed in each fin on sides of each gate structure (e.g., in Step S806 in FIG. 7).

The base substrate may be made from an initial substrate and may provide a platform for forming the semiconductor structure. In one embodiment, the initial substrate may be made of single crystal silicon, and correspondingly the substrate 100 and fins 101 may also be made of single crystal silicon.

In other embodiments, the initial substrate may be made of a semiconductor material including germanium, GaAs, and/or SiGe. The initial substrate may also be an epitaxial layer or a silicon structures on an epitaxial layer.

In some embodiments, the substrate 100 and the fins 101 may be made of different materials. The initial substrate may include a semiconductor substrate and a semiconductor layer on the semiconductor substrate. The semiconductor substrate may be made of a material meeting technical process requirements or easy to be integrated. The semiconductor layers may be made of a material which is easy for forming fins.

A process for etching the initial substrate may include: forming a patterned fin mask layer on the initial substrate (not shown in the figures); and forming the substrate 100 and the discrete fins 101 by etching the initial substrate using the fin mask layer as an etch mask.

The substrate 100 may further include an isolation layer 102 on the substrate 100 between two adjacent fins 101, to electrically insulate the adjacent fins and to insulate the multiple semiconductor devices on the substrate 100.

In various embodiments, the isolation layer 102 may be made of a material including $SiO_2$, $SiN_x$, and/or $SiN_xO_y$.

The isolation layer 102 may be formed by: forming an isolation material layer on the substrate 100 between the adjacent fins 101 to cover the fin mask layer; removing a partial thickness of the isolation material layer, for forming the isolation layer 102. The isolation layer 102 may have a top surface lower than the fins 101 and may expose a portion of the sidewalls of each fin 101.

The present disclosure is described by using an embodiment where the substrate 100 includes an N-type region I for forming an N-type device and a P-type region II for forming a P-type device as an example, and it should not limit the scope of the present disclosure. In other embodiments, the substrate 100 may only include an N-type region for forming an N-type device, or may only include a P-type region for forming a P-type device.

In one embodiment, the N-type region I and the P-type region II may be adjacent to each other. In other embodiments, the N-type region I and the P-type region II may be not adjacent to each other.

The gate structures may be used for forming the gates of the transistors. Each gate structure may also cover a portion of the fins 101 when subsequently forming source regions and/or drain regions of the transistors, so the source regions and/or the drain regions of the transistors may not directly contact each other.

Each gate structure may include a gate dielectric layer 103 on a fin 101 and a gate electrode 104 on the gate dielectric layer 103.

In other embodiments, the gate structures may be dummy gate structures, and may occupy spaces for subsequently forming the gate structures.

The gate dielectric layers 103 may be used to separate the gate electrodes 104 from the channels, and may be made of $SiO_2$ or another gate dielectric material with a dielectric constant higher than $SiO_2$.

In various embodiments, the gate dielectric layers 103 may be formed by an atomic layer deposition method, a chemical vapor deposition method, or a physical vapor deposition method.

The gate electrodes 104 may be made of polysilicon or a metal.

In one embodiment, the method may further include: forming an interface layer 105 on each gate electrode 104; forming a first hard mask layer 106 on the interface layer 105; forming a second hard mask layer 107 on the first hard mask layer 106; and forming gate spacers 108 on sidewalls of the gate electrode 104, on sidewalls of the interface layer 105, on sidewalls of the first hard mask layer 106, and on sidewalls of the second hard mask layer 107.

The interface layer 105 may reduce a density of the interface states between the gate electrode 104 and the first hard mask layer 106, and may avoid negative effects induced by direct contacts between the gate electrode 104 and the corresponding first hard mask layer 106. In one embodiment, the interface layer 105 may be made of a material including $SiO_2$.

The first hard mask layer 106 and second hard mask layer 107 may be used to define sizes and positions of the gate structures. In one embodiment, the first hard mask layer 106 may be made of $SiN_x$, and the second hard mask layer 107 may be made of $SiO_2$.

The gate spacer 108 may be used to control a distance between the channels and epitaxial layers to be formed. In one embodiment, the gate spacer 108 may be a single-layer structure made of $SiN_x$. In another embodiment, the gate spacer 108 may be made of a material including $SiO_2$, $SiN_xO_y$, SiC, SiCO, and/or SiCNO. The gate spacer 108 also may be a multilayer structure.

Subsequently, source/drain doped regions may be formed in the fins on sides of each gate structure, as shown in FIG. 2.

In one embodiment, the stress layers in the N-type region I may be used as first stress layers 109, and the stress layers in the P-type region II may be used as second stress layers 110. The first stress layers 109 may be used for forming the source/drain doped regions of the N-type device, and the second stress layers 110 may be used for forming the source/drain doped regions of the P-type device.

The first stress layers 109 and the second stress layers 110 may be formed by: forming a patterned first mask material layer on the fins 101 and on the gate structures, to cover the P-type region II and the sidewalls of the gate structures in the N-type region I; etching the fins 101 in the N-type region I by using the patterned first mask material layer as a mask for forming grooves; forming a first stress layer in each formed groove; forming a second mask material layer on the first mask material layer in the P-type region II, on the first stress layers 109, and on the gate structures in the N-type region I; patterning the first mask material layer and the second mask material layer, to grooves in the fins 101 in the P-type region II; forming a second stress layer in each formed groove; removing a portion of the first mask material layer on the first stress layers 109 and on the top of the gate structures in the N-type region I. The remaining first mask material layer on the sidewalls of the gate structures may be used as a first mask layer 111, and the remaining second mask material layer on the sidewalls of the gate structures may be used as a second mask layer 112.

In one embodiment, the first stress layers 109 in the N-type region I may be formed first. In other embodiments, the second stress layers 110 in the P-type region II may be formed first.

The first stress layers 109 may be made of SiP, and may have a shape of "U". The first stress layers 109 may exert a tensile stress on channel regions of the N-type region I through a mismatch of crystal lattices between Si and SiP. Correspondingly, mobilities of carriers in the channel regions and then the performance of the transistors may be improved.

The second stress layers 109 may be made of SiGe, and may have a shape of "Σ". The second stress layers 109 may exert a compressive stress on channel regions of the P-type region II through a mismatch of crystal lattices between Si and SiGe. Correspondingly, mobilities of the carriers in the channel regions and then the performance of the transistors may be improved.

The stress layers may be formed by epitaxial growth processes in the grooves.

Figure 3:
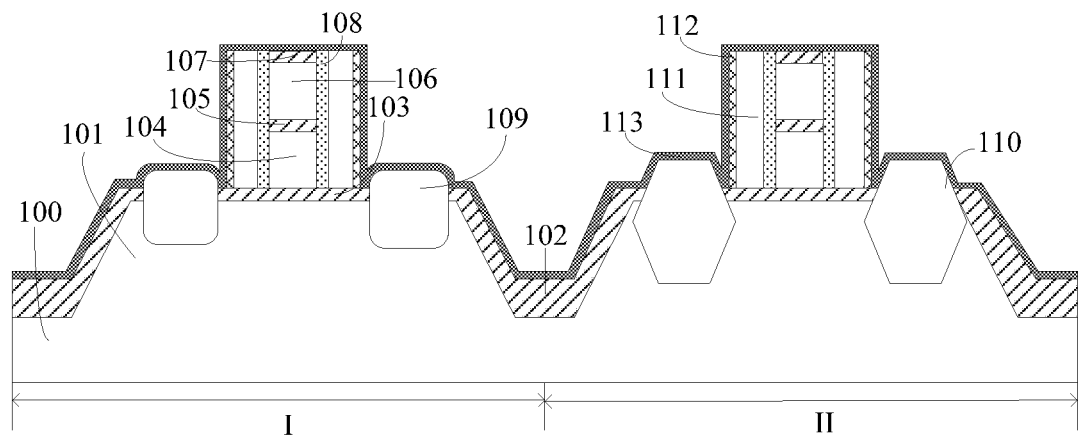
Figure 4:
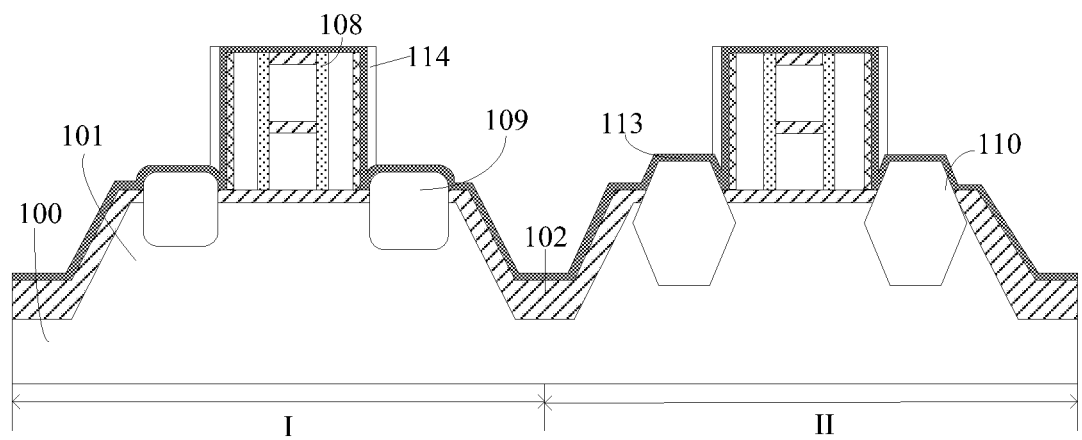

Referring to FIG. 3 and FIG. 4, barrier layers 114 may be formed on the sidewalls of each gate structure (e.g., in Step S808 in FIG. 7).

The barrier layers 114 may block damages to the gate structure when implanting ions in a portion the fins on sides of each gate structure in the first ion implantation processes.

As illustrated in FIG. 3, a stop layer 113 may be formed on the gate structures and on the stress layers. The stop layer 113 may cover the gate structures, the first stress layers 109, and the second stress layers 110.

The stop layers 113 may protect the stress layers and the fins in the first ion implantation processes.

The stop layer 113 may be made of $SiO_2$, and may be formed by an atomic layer deposition method, a chemical vapor deposition method, or a physical vapor deposition method.

As illustrated in FIG. 4, the barrier layers 114 may be formed on the sidewalls of each gate structure and the formed barrier layers 114 may be outside the stop layer 113 (e.g., in Step S808 in FIG. 7).

The barrier layers 114 may be formed by: forming a barrier material layer on the stop layer 113; forming a pattern layer on the barrier material layer; and etching the barrier material layer using the pattern layer as an etch mask, to form the barrier layers 114.

The barrier layers 114 may be made of $SiO_2$, and may be formed by a chemical vapor deposition process. The barrier material layer may be etched by a dry etching method including a plasma etching method.

Figure 5:
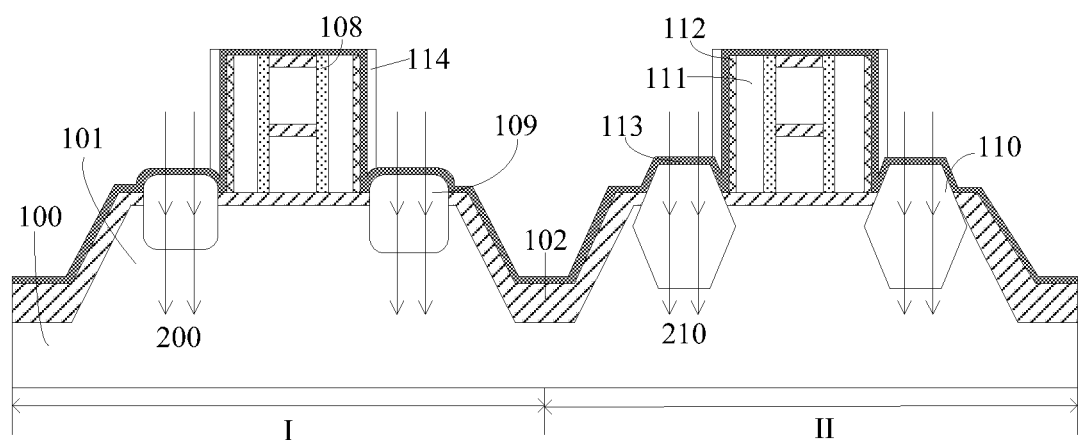

As illustrated in FIG. 5, first ion implantation processes may be applied on a portion of the fins under the stress layers to form doped regions (e.g., in Step S810 in FIG. 7).

The method may further include applying a second ion implantation process to the stress layers for forming stress layer doped regions after forming the barrier layers 114. The stress layer doped regions and the doped regions may together form the source/drain doped regions of the semiconductor structure.

The process for forming the source/drain doped regions may further include an annealing process.

In one embodiment, the first ion implantation processes may be performed before the second ion implantation process. In other embodiments, the first ion implantation processes may be performed after the second ion implantation process.

In one embodiment, implanting ions in the N-type first ion implantation process 200 on the N-type devices may be arsenic (As) ions, and an implanting energy may be about 2 keV to about 30 keV. Implanting ions in the P-type first ion implantation process 210 on the P-type devices may be boron (B) ions, and an implanting energy may be about 1 keV to about 10 keV.

Because the doped regions may have a deep depth, the first ion implantation processes may require a high implanting energy. The barrier layers 114 may block the ion implantation near the sides of the gate structures, and avoid the damage to the gate structures induced by the high implanting energy. Correspondingly, the performance of the formed semiconductor structure may be improved.

The barrier layers 114 may have a thickness in an appropriate range. If the thickness of the barrier layers 114 is too small, the first ion implantation with a high implanting energy near the sides of the gate structures may not be effectively blocked. If the thickness of the barrier layers 114 is too large, the regions being ion implanted in the stress layers may become too small and the formation of the source/drain doped regions in the semiconductor structure may be difficult. In one embodiment, the semiconductor structure may have N-type devices and the thickness of the barrier layers may be about 50 Å to about 300 Å. In other embodiments, the semiconductor structure may have P-type devices and the thickness of the barrier layers may be about 50 Å to about 250 Å.

In other embodiments, the stop layer 113 may be not formed on the stress layers and on the gate structures.

In other embodiments, the N-type first implanting ions may include phosphor or antimony; the P-type first implanting ions may include gallium or indium.

The stop layer 113 may protect the stress layers and the fins, when applying the second ion implantation process to the stress layers and applying the first ion implantation processes to the fins under the stress layers. Correspondingly, a thickness of the stop layer 113 should be in an appropriate range. If the thickness of the stop layer 113 is too large, the processing materials may be wasted; if the thickness of the stop layer 113 is too small, the stop layer 113 may not effectively protect the stress layers and the fins.

Figure 6:
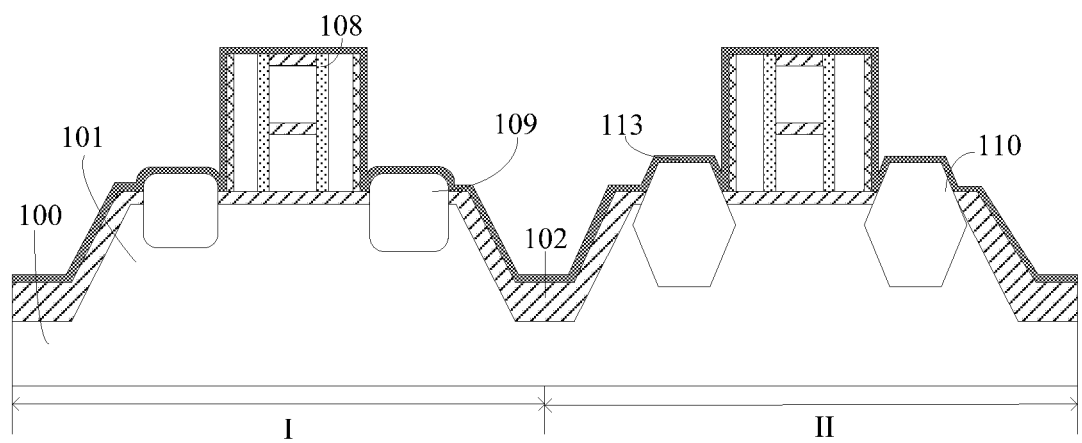
Figure 6A:
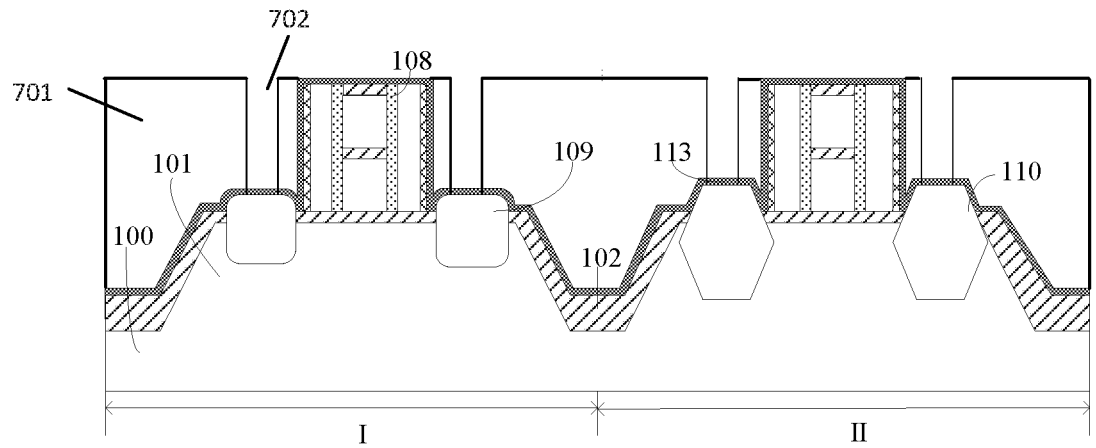
Figure 7:
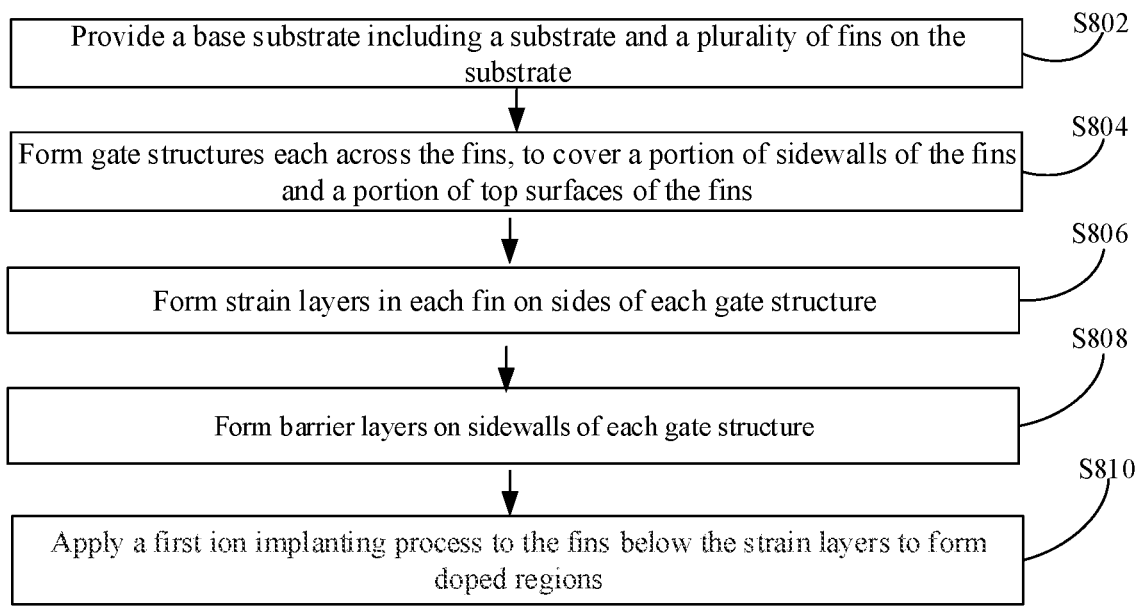
FIG. 7 illustrates an exemplary method for forming a semiconductor structure according to various disclosed embodiments.

As illustrated in FIG. 6, after forming the doped regions, the method may further include: removing the barrier layers 114; As illustrated in FIG. 6A, after removing the barrier layers 114, forming a dielectric layer 701 on the stop layer 113; forming through holes 702 in the dielectric layer 701 by using the stop layer 113 as an etch stop layer; and forming conductive plugs in the through holes.

The stop layer 113 may protect the stress layers and the fins in the ion implantation processes, and may be used as an etch stop layer when forming the through holes. Correspondingly, the performance of the semiconductor may be improved. The process may be simplified and the process efficiency may be improved simultaneously.

The fabrication method in the present disclosure may be used for forming input/output devices. Since the gate dielectric layers may be preserved in the subsequent process for forming the input/output devices, the fabrication method in the present disclosure may effectively protect the gate structures and improve the performance of the input/output device.

Various embodiments in the present disclosure also provide a semiconductor structure as shown in FIG. 6. The semiconductor structure may include: a substrate 100 with a plurality of fins 101 protruding from the substrate 100; gate structures each across the fins 101 and covering a portion of the sides and a portion of the top surfaces of the fins 101; stress layers in each fin on sides of each gate structure where each stress layer may include a stress layer doped region; a doped region in the fin under each stress layer; a stop layer 113 on the gate structures and on the stress layers; barrier layers 114 on the sides of each gate structure and outside of the stop layer 113. The doped regions and the stress layer doped regions may together constitute source/drain doped regions of the semiconductor structure.

In one embodiment, the substrate 100 may include an N-type region I for forming an N-type device and a P-type region II for forming a P-type device. In other embodiments, the substrate 100 may only include the N-type region for forming the N-type device, or may only include a P-type region for forming the P-type device.

In one embodiment, the N-type region I and the P-type region II may be adjacent to each other. In other embodiments, the N-type region I and the P-type region II may be not adjacent to each other.

The substrate 100 may be made of a material including silicon, germanium, SiGe, SiC, GaAs, and/or InGa. The substrate 100 may also be a silicon substrate on an insulator or a germanium substrate on an insulator. The fins 11 may be made of a material including silicon, germanium, SiGe, SiC, GaAs, and/or InGa.

In one embodiment, the substrate 100 may further include an isolation layer 102 on the substrate 100 between the adjacent fins 101, to electrically insulate the adjacent fins and the multiple semiconductor structures on the substrate 100 from each other. In various embodiments, the isolation layer 102 may be made of a material including $SiO_2$, $SiN_x$, or $SiN_xO_y$.

The gate structures may be used for forming the gates of the transistors, and also to cover a portion of the fins 101 when subsequently forming source regions and drain regions of the transistors. Correspondingly, the source regions and the drain regions of the transistors may not directly contact each other. In other embodiments, the gate structures may be dummy gate structures which may be used to occupy spaces for forming the gate structures.

In one embodiment, each gate structure may include a gate dielectric layer 103 on the fin 101 and a gate electrode 104 on the gate dielectric layer 103. An interface layer 105 may be further formed on the gate electrode 104. A first hard mask layer 106 may be formed on the interface layer 105, and a second hard mask layer 107 may be formed on the first hard mask layer 106. Further, gate spacers 108 may be formed on sidewalls of the gate electrode 104, on sidewalls of the interface layer 105, on sidewalls of the first hard mask layer 106 and on sidewalls of the second hard mask layer 107.

The gate dielectric layer 103 may be used to separate the gate electrode 104 from channels, and may be made of $SiO_2$ or another gate dielectric material with a dielectric constant higher than $SiO_2$.

The gate electrode 104 may be made of polysilicon or a metal.

The interface layer 105 may be used to reduce a density of interface states between the gate electrode 104 and the first hard mask layer 106, and avoid negative effects induced by direct contacts between the gate electrode 104 and the first hard mask layer 106. In one embodiment, the interface layer 105 may be made of $SiO_2$.

The first hard mask layer 106 and second hard mask layer 107 may be used to define sizes and positions of the gate structures. In one embodiment, the first hard mask layer 106 may be made of $SiN_x$, and the second hard mask layer may be made of $SiO_2$.

The gate spacers 108 may be used to control a distance between the channels and epitaxial layers to be formed. In one embodiment, a gate spacer 108 may be single-layer structures of $SiN_x$. In other embodiments, the gate spacers 108 may be made of a material including $SiO_2$, $SiN_xO_y$, SiC, SiCO, and/or SiCNO. A gate spacer 108 may be a multilayer structure.

In one embodiment, the stress layers in the N-type region I may be used as first stress layers 109, and the stress layers in the P-type region II may be used as second stress layers 110. The first stress layers 109 may be used for forming the source/drain doped regions of the N-type devices, and the second stress layers 110 may be used for forming the source/drain doped regions of the P-type devices.

The first stress layers 109 may be made of SiP, and may have a shape of "U". The first stress layers 109 may exert a tensile stress on channel regions of the N-type region I through a mismatch in crystal lattices between Si and SiP. Correspondingly, mobilities of carriers in the channel regions and then the performance of the transistors may be improved.

The second stress layers 109 may be made of SiGe, and may have a shape of "Σ". The second stress layers 109 may exert a compressive stress on channel regions of the P-type region II through a mismatch of crystal lattices between Si and SiGe. Correspondingly, mobilities of the carriers in the channel regions and then the performance of the transistors may be improved.

In one embodiment, first mask layers 111 and second mask layers 112 may be further formed on the sidewalls of the gate structures.

The stop layer 113 may protect the stress layers and the fins when applying the second ion implantation process to the stress layers and applying the first ion implantation processes to the fins under the stress layers. The stop layer 113 may also define an etching stop position when forming conductive plugs. Correspondingly, a thickness of the stop layer 113 should be in an appropriate range. If the thickness of the stop layer 113 is too large, the processing materials may be wasted; if the thickness of the stop layer 113 is too small, the stop layer 113 may not effectively protect the stress layers and the fins. In one embodiment, the thickness of the stop layer 113 may be 60 Å to 200 Å.

The barrier layers 114 may block the ion implantation near the sides of the gate structures, and avoid the damage to the gate structures induced by the high implanting energy. Correspondingly, the performance of the formed semiconductor structure may be improved. The barrier layers 114 may be made of $SiO_2$.

The barrier layers 114 may have a thickness in an appropriate range. If the thickness of the barrier layers 114 is too small, the first ion implantation with a high implanting energy near both sides of the gate structures could not be effectively blocked. If the thickness of the barrier layers 114 is too large, the regions being ion implanted in the stress layers may become too small and the formation of the source/drain doped regions in the semiconductor structure may be difficult. In one embodiment, the semiconductor structure may have N-type devices and the thickness of the barrier layers may be about 50 Å to about 300 Å. In other embodiments, the semiconductor structure may have P-type devices and the thickness of the barrier layers may be about 50 Å to about 250 Å.

In one embodiment, the formed semiconductor structure may include input/output devices.

In the method of the present disclosure, the barrier layers may be formed on the sidewalls of each gate structure after forming the stress layer in each fin on sides of each gate structure, and the first ion implantation processes may be subsequently performed on a portion of the fins under the stress layers to form the doped regions. The ion implantation processes may require a high implantation depth and a high ion injection energy. The barrier layers may block the ion implantation near sides of the gate structures, and avoid the damage to the gate structures because of the high ion implantation energy. Correspondingly, the performance of the formed semiconductor structures may be improved.

Further, the stop layer may be formed on the stress layers and on the gate structures after forming the stress layers but before forming the barrier layers. The stop layer may protect the stress layers and the fins in the ion implantation process, and also may define the stop position when etching the conductive through holes. Correspondingly, the method of the present disclosure may simultaneously improve the performance of the formed semiconductor structure, simplify the fabrication process, and enhance the process efficiency.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a semiconductor structure, comprising:
providing a base substrate including a substrate and a plurality of fins on the substrate;
forming gate structures each across the fins, each gate structure includes a gate dielectric layer, a gate electrode on the gate dielectric layer, an interface layer on the gate electrode, a first hard mask layer on the interface layer, a second hard mask layer on the first hard mask layer, gate spacers on sidewalls of the gate electrode, sidewalls of the interface layer, sidewalls of the first hard mask layer, and sidewalls of the second mask layer, a first mask layer on the gate spacers, and a second mask layer on the first mask layer;
forming stress layers in each fin on sides of each gate structure;
after forming the stress layers and before forming barrier layers, forming a stop layer on the stress layers and on the gate structures;
forming the barrier layers on sidewalls of each gate structure after forming the stop layer;
forming doped regions by a first ion implantation process on a portion of the fins under the stress layers using the barrier layers as an etch mask.

2. The method according to claim 1, wherein:
the stop layer is made of a material including silicon nitride.

3. The method according to claim 2, wherein:
the stop layer has a thickness of about 60 Å to about 200 Å.

4. The method according to claim 1, wherein:
when the semiconductor structure includes an N-type device, the first ion implantation process is performed using implanting ions including arsenic ions, and an implanting energy of about 2 keV to about 30 keV; and
when the semiconductor structure has P-type devices, the first ion implantation process is performed using implanting ions including boron ions, and an implanting energy of about 1 keV to about 10 keV.

5. The method according to claim 1, wherein:
when the semiconductor structure includes an N-type device, the barrier layers have a thickness of about 50 Å to about 300 Å; and
when the semiconductor structure includes a P-type device, the barrier layers have a thickness of about 50 Å to about 250 Å.

6. The method according to claim 1, wherein:
the barrier layers are made of a material including silicon oxide.

7. The method according to claim 1, wherein:
when the semiconductor structure includes an N-type device, the first ion implantation process is performed using implanting ions including arsenic ions, and an implanting energy of about 2 keV to about 30 keV; and
when the semiconductor structure has P-type devices, the first ion implantation process is performed using implanting ions including boron ions, and an implanting energy of about 1 keV to about 10 keV.

8. The method according to claim 1, after forming the barrier layers, further including:
forming stress layer doped regions by performing a second ion implantation process on the stress layers;
wherein:
the stress layer doped regions and the doped regions together constitute the source/drain doped regions of the semiconductor structure.

9. The method according to claim 8, further including:
performing an annealing process after the ion implantation processes for forming the source/drain doped regions.

10. The method according to claim 1, wherein:
the substrate includes an N-type region for forming N-type devices and a P-type region for forming P-type devices.

11. The method according to claim 1, wherein:
the semiconductor structure includes input/output devices.

12. The method according to claim 1, further including:
removing the barrier layers after forming the doped regions.

13. The method according to claim 12, after removing the barrier layers, further including:
forming a dielectric layer on the stop layer;
forming through holes in the dielectric layer by using the stop layer as an etch stop layer; and
forming conductive plugs in the through holes.

14. The method according to claim 1, wherein the stop layer is directly on and directly covers the second mask layer, the first mask layer, the gate spacers, and the second hard mask layer.

* * * * *